United States Patent
Sasaki et al.

(10) Patent No.: US 8,950,469 B2
(45) Date of Patent: Feb. 10, 2015

(54) TEMPERATURE CONTROL SYSTEM AND TEMPERATURE CONTROL METHOD FOR SUBSTRATE MOUNTING TABLE

(75) Inventors: Yasuharu Sasaki, Yamanashi (JP); Ryo Nonaka, Yamanashi (JP); Nobuyuki Nagayama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1157 days.

(21) Appl. No.: 12/902,225

(22) Filed: Oct. 12, 2010

(65) Prior Publication Data

US 2011/0083837 A1    Apr. 14, 2011

Related U.S. Application Data

(60) Provisional application No. 61/265,564, filed on Dec. 1, 2009.

(30) Foreign Application Priority Data

Oct. 14, 2009   (JP) ................................ 2009-237225

(51) Int. Cl.
  *B31F 1/00*     (2006.01)
  *B44C 1/175*    (2006.01)
  *B29C 65/00*    (2006.01)
  *H01L 21/67*    (2006.01)

(52) U.S. Cl.
  CPC .... *H01L 21/67248* (2013.01); *H01L 21/67109* (2013.01)
  USPC ........... 165/201; 165/236; 165/266; 165/80.4

(58) Field of Classification Search
  USPC ............... 165/201, 236, 266, 287, 80.1, 80.4, 165/80.5, 104.14, 47, 61; 118/724, 725; 156/345.52, 345.53
  See application file for complete search history.

(56) References Cited

U.S. PATENT DOCUMENTS

| | | | | |
|---|---|---|---|---|
| 3,556,201 | A * | 1/1971 | Wolfgang Sander | 165/253 |
| 6,026,896 | A * | 2/2000 | Hunter | 165/206 |
| 6,993,922 | B2 * | 2/2006 | Wall et al. | 62/223 |
| 7,230,202 | B2 * | 6/2007 | Hayashi et al. | 219/121.43 |
| 2004/0095974 | A1 * | 5/2004 | Gibson | 372/35 |

(Continued)

FOREIGN PATENT DOCUMENTS

| | | |
|---|---|---|
| CN | 101373731 A | 2/2009 |
| JP | 07-183276 A | 7/1995 |

(Continued)

*Primary Examiner* — Allana Lewin
*Assistant Examiner* — Travis Ruby
(74) *Attorney, Agent, or Firm* — Pearne & Gordon LLP

(57) ABSTRACT

A temperature control system includes a heat transfer medium supply configured to supply a first heat transfer medium of a first temperature into a heat transfer medium path; at least one heat transfer medium storage provided between the heat transfer medium path and the heat transfer medium supply and configured to store a second heat transfer medium of a second temperature higher than the first temperature; a heat transfer medium supply control device provided between the heat transfer medium supply and the heat transfer medium path and between the heat transfer medium storage and the heat transfer medium path and configured to stop a supply of the first heat transfer medium into the heat transfer medium path from the heat transfer medium supply and to supply the second heat transfer medium into the heat transfer medium path from the heat transfer medium storage when a heating unit generates heat.

6 Claims, 8 Drawing Sheets

(56) References Cited

U.S. PATENT DOCUMENTS

2007/0267188 A1* 11/2007 Di Stefano et al. ............ 165/296
2008/0223555 A1* 9/2008 Di Stefano .................... 165/101
2008/0314564 A1* 12/2008 Nagaseki et al. ......... 165/104.31

FOREIGN PATENT DOCUMENTS

| JP | 09-298192 A | 11/1997 |
| JP | 10-064984 A | 3/1998 |
| JP | 2002-353298 A | 12/2002 |

* cited by examiner

TEMPERATURE CONTROL SYSTEM AND TEMPERATURE CONTROL METHOD FOR SUBSTRATE MOUNTING TABLE

CROSS-REFERENCE TO RELATED APPLICATION

This application claims the benefit of Japanese Patent Application No. 2009-237225 filed on Oct. 14, 2009 and U.S. Provisional Application Ser. No. 61/265,564 filed on Dec. 1, 2009, the entire disclosures of which are incorporated herein by reference.

FIELD OF THE INVENTION

The present disclosure relates to a temperature control system and a temperature control method for a substrate mounting table that mounts thereon a substrate on which a plasma process is performed.

BACKGROUND OF THE INVENTION

A substrate processing apparatus for performing a plasma process on a wafer as a substrate includes an evacuable chamber that accommodates the wafer therein; a shower head that introduces a processing gas into the chamber; and a susceptor (mounting table) that is positioned to face the shower head within the chamber and serves to mount the wafer thereon and applies a high frequency power to the inside of the chamber. The processing gas introduced into the chamber is excited into plasma by the high frequency power, and positive ions or radicals in the plasma are used for the plasma process of the wafer.

While the plasma process is being performed, the wafer may receive heat from the plasma, and, thus, a temperature of the wafer increases. If the temperature of the wafer increases, radical distribution on the wafer changes and a chemical reaction rate on the wafer also varies. Accordingly, to achieve a desired result in the plasma process, the temperature of the wafer, more specifically, the temperature of the susceptor mounting the wafer needs to be controlled.

In this regard, in accordance with a recent substrate processing apparatus, a heat transfer heater and a coolant path are provided within a susceptor to control the temperature of the susceptor. The heat transfer heater may heat the susceptor, and a coolant flowing through the coolant path may cool the susceptor. Here, a temperature of the coolant or a flow rate of the coolant may not be accurately controlled, whereas a heat generation amount of the heat transfer heater can be accurately controlled. Thus, in order to accurately control the temperature of the susceptor, the heat transfer heater is operated when necessary while constantly flowing the coolant through the coolant path (see, for example, Patent Document 1).

Patent Document 1: Japanese Patent Laid-open Publication No. H7-183276

In the above-mentioned substrate processing apparatus, however, since the coolant constantly flows through the coolant path, a part of heat from the heat transfer heater may be absorbed into the coolant flowing through the coolant path even when it is attempted to increase the temperature of the susceptor by generating heat from the heat transfer heater. Thus, it takes time to increase the temperature of the susceptor and, also, the temperature of the wafer. Furthermore, since not a total amount of heat from the heat transfer heater is used for the temperature rise of the susceptor, there has been a great loss of thermal energy.

BRIEF SUMMARY OF THE INVENTION

In view of the foregoing, the present disclosure provides a temperature control system and a temperature control method for a substrate mounting table, capable of rapidly increasing a temperature of a substrate while reducing a loss of thermal energy.

In accordance with one aspect of the present disclosure, there is provided a temperature control system for a substrate mounting table that includes a heating unit and a heat transfer medium path and mounts thereon a substrate on which a preset process is performed. The temperature control system includes a heat transfer medium supply connected with the heat transfer medium path and configured to supply a first heat transfer medium of a first temperature into the heat transfer medium path; at least one heat transfer medium storage provided between the heat transfer medium path and the heat transfer medium supply and configured to store therein a second heat transfer medium of a second temperature higher than the first temperature; a heat transfer medium supply control device provided between the heat transfer medium supply and the heat transfer medium path and between the heat transfer medium storage and the heat transfer medium path and configured to stop a supply of the first heat transfer medium into the heat transfer medium path from the heat transfer medium supply and to supply the second heat transfer medium into the heat transfer medium path from the heat transfer medium storage when the heating unit generates heat.

In the temperature control system, the heat transfer medium path may have an inlet and an outlet, and the at least one heat transfer medium storage may be two in number. The two heat transfer medium storages may be respectively provided between the inlet of the heat transfer medium path and the heat transfer medium supply and between the outlet of the heat transfer medium path and the heat transfer medium supply. The heat transfer medium supply control device may supply the second heat transfer medium from one of the two heat transfer medium storages into the other one of the two heat transfer medium storages via the heat transfer medium path when the heating unit generates heat, and supply the second heat transfer medium from the other one of the two heat transfer medium storages into the one of the two transfer medium storages via the heat transfer medium path when the heating unit generates heat in a next process.

In the temperature control system, the at least one heat transfer medium storage may include a medium heating unit that heats the second transfer medium stored in the at least one heat transfer medium storage.

In the temperature control system, the second temperature may be lower than a desired temperature of the substrate mounting table for the preset process.

In accordance with another aspect of the present disclosure, there is provided a temperature control method for a substrate mounting table that includes a heating unit and a heat transfer medium path and mounts thereon a substrate on which a preset process is performed. The temperature control method includes increasing a temperature of the substrate mounting table by generating heat from the heating unit; maintaining the temperature of the substrate mounting table at a preset temperature; and decreasing the temperature of the substrate mounting table. A first heat transfer medium of a first temperature is supplied into the heat transfer medium path in the temperature maintaining process and in the temperature decreasing process, whereas, in the temperature increasing process, the supply of the first heat transfer medium into the heat transfer medium path is stopped and a second heat transfer medium of a second temperature higher than the first temperature is supplied into the heat transfer medium path.

In the temperature control method, a heat transfer medium supply connected with the heat transfer medium path may supply the first heat transfer medium into the heat transfer medium path in the temperature maintaining process and in the temperature decreasing process, whereas, in the temperature increasing process, at least one heat transfer medium storage provided between the heat transfer medium path and the heat transfer medium supply and storing therein the second heat transfer medium may supply the second heat transfer medium into the heat transfer medium path.

In the temperature control method, the heat transfer medium path may have an inlet and an outlet, and the at least one heat transfer medium storage may be two in number. The two heat transfer medium storages may be respectively provided between the inlet of the heat transfer medium path and the heat transfer medium supply and between the outlet of the heat transfer medium path and the heat transfer medium supply. One of the two heat transfer medium storages may supply the second heat transfer medium into the other one of the two heat transfer medium storages via the heat transfer medium path in a next temperature increasing process, and the other one of the two heat transfer medium storages may supply the second heat transfer medium into the one of the two heat transfer medium storages via the heat transfer medium path in the temperature increasing process.

In the temperature control method, the second temperature may be lower than a desired temperature for the substrate mounting table in the preset process.

In the temperature increasing process, the supply of the second heat transfer medium into the heat transfer medium path may be stopped and the first heat transfer medium may be supplied into the heat transfer medium path before the temperature increasing process is terminated.

In accordance with the aforementioned temperature control system and the temperature control method for the substrate mounting table, when the heating unit embedded in the substrate mounting table generates heat, the supply of the first heat transfer medium of the first temperature into the heat transfer medium path embedded in the substrate mounting table is stopped, and, instead, the second heat transfer medium of the second temperature higher than the first temperature is supplied into the heat transfer medium path. Accordingly, since a part of heat from the heating unit can be suppressed from being absorbed into the second heat transfer medium flowing through the heat transfer medium path, a temperature of the substrate mounting table and, also, a temperature of the substrate can be rapidly increased, and loss of thermal energy can be reduced.

In accordance with the aforementioned temperature control system and the temperature control method for the substrate mounting table, when the heating unit generates heat, the second heat transfer medium is supplied into one of the heat transfer medium storages from the other one of the heat transfer medium storages via the heat transfer medium path. Then, when the heating unit generates heat in a next process, the second heat transfer medium is supplied from the other one of the high temperature medium storages into the one of the high temperature medium storages via the heat transfer medium path. Accordingly, the high temperature medium can be reutilized while its temperature is hardly reduced. As a result, it may not be necessary to heat a low temperature medium to the second temperature, and, thus, thermal energy can be saved.

Further, in accordance with the aforementioned temperature control system for the substrate mounting table, since the heat transfer medium storage has the medium heating unit for heating the second heat transfer medium, a temperature of the second heat transfer medium can be increased up to the second temperature before it is reutilized. Accordingly, even when the second heat transfer medium is reused, absorption of a part of heat from the heating unit into the second heat transfer medium flowing through the heat transfer medium path can be securely suppressed.

Furthermore, in accordance with the aforementioned temperature control system and the temperature control method for the substrate mounting table, since the second temperature is lower than the desired temperature of the substrate mounting table for the preset process, overheating of the substrate mounting table beyond the desired temperature for the substrate mounting table by the second heat transfer medium can be prevented when the heating unit generates heat.

Moreover, in accordance with the aforementioned temperature control method for the substrate mounting table, when the temperature of the substrate mounting table is maintained at the preset temperature or when the temperature of the substrate mounting table is reduced, the first heat transfer medium is supplied into the heat transfer medium path from the heat transfer medium supply connected with the heat transfer medium path. On the other hand, when the heating unit generates heat, the second heat transfer medium is supplied into the heat transfer medium path from the heat transfer medium storage provided between the heat transfer medium path and the heat transfer medium supply. Accordingly, a temperature of the heat transfer medium path can be rapidly altered, so that absorption of a part of heat from the heating unit into the second heat transfer medium flowing through the heat transfer medium path can be more effectively suppressed.

In addition, in accordance with the aforementioned temperature control method for the substrate mounting table, in the temperature increasing process, the supply of the second heat transfer medium into the heat transfer medium path is stopped and the first heat transfer medium is supplied into the heat transfer medium path before the temperature increasing process is terminated. Accordingly, overheating of the substrate mounting table can be suppressed effectively.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments of the present disclosure will be described in detail with reference to the accompanying drawings.

Figure 1:
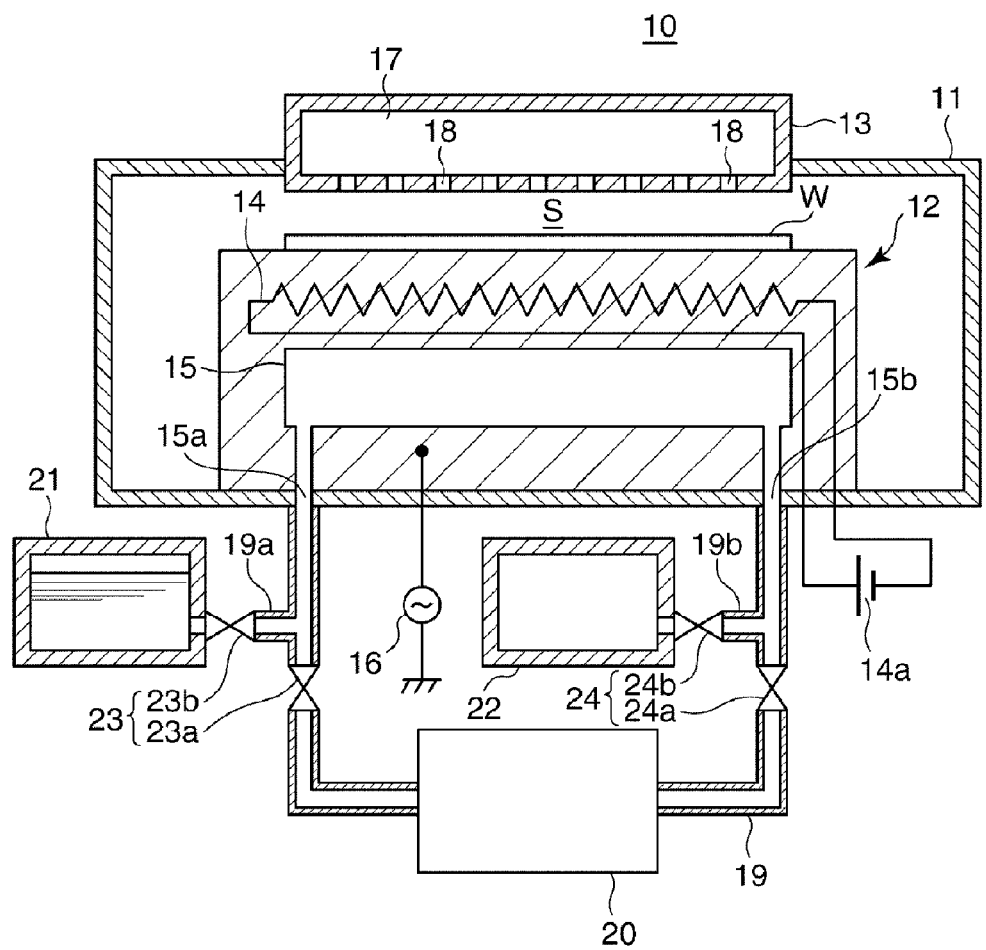
FIG. 1 is a cross sectional view illustrating a schematic configuration of a substrate processing apparatus including a temperature control system for a substrate mounting table in accordance with an embodiment of the present disclosure.

FIG. 1 is a cross sectional view illustrating a schematic configuration of a substrate processing apparatus including a temperature control system for a substrate mounting table in accordance with an embodiment of the present embodiment. The substrate processing apparatus performs a plasma etching process on a wafer for a semiconductor device (hereinafter, simply referred to as a 'wafer') as a substrate.

A substrate processing apparatus 10 in FIG. 1 includes a chamber 11 that accommodates therein the wafer W for the semiconductor device. A cylindrical susceptor (substrate mounting table) 12 is provided in a lower portion of the chamber 11, and a circular plate-shaped shower head 13 is provided in an upper portion of the chamber 11 to face the susceptor 12.

The susceptor 12 includes an electrostatic chuck (not shown), a heater (heating unit) 14, and a heat transfer medium path 15 through which a coolant flows. The coolant is a heat transfer medium selected based on a kind of a plasma etching process. The wafer W is mounted on a top surface (hereinafter, referred to as a "mounting surface") of the susceptor 12. The electrostatic chuck attracts and holds the wafer W electrostatically on the mounting surface by, e.g., a Coulomb force. The heater 14 is composed of a resistor installed in the susceptor 12 so as to correspond to a substantially entire region of the mounting surface of the susceptor 12. The heater 14 may generate heat by a voltage applied from a power supply 14a, and the heater 14 may heat the susceptor 12 and, also, the wafer W via the susceptor 12. The heat transfer medium path 15 is also provided to correspond to the substantially entire region of the mounting surface of the susceptor 12. The heat transfer medium path 15 may cool the susceptor 12 and also cool the wafer W via the susceptor 12 by absorbing heat from the susceptor 12 and from the wafer W into the coolant flowing in the heat transfer medium path 15. Further, since a high frequency power supply 16 is connected with the susceptor 12, the susceptor 12 also functions as a lower electrode that applies a high frequency power into a processing space S between the susceptor 12 and the shower head 13.

The shower head 13 includes a buffer room 17; and a plurality of gas holes 18 that allow the buffer room 17 and the processing space S to communicate with each other. A processing gas is supplied into the buffer room 17 from an external processing gas supply unit (not shown), and the supplied processing gas is introduced into the processing space S through the gas holes 18. In the substrate processing apparatus 10, since the high frequency power is applied into the processing space S, the processing gas introduced into the processing space S is excited into plasma, and a plasma etching process is performed on the wafer W by positive ions or radicals included in the generated plasma.

During the plasma etching process, since the wafer W keeps receiving heat from the plasma, a temperature of the wafer W may be increased beyond a preset temperature. The plasma etching process is performed using a gas phase reaction between an etching target object and the processing gas (etching gas). Here, if the temperature of the wafer W as the etching target object excessively increases over a certain temperature in the substrate processing apparatus 10, an unexpected gas phase reaction may occur, and, thus, a desired result may not be obtained. Accordingly, the substrate processing apparatus 10 is equipped with a coolant circulation system (temperature control system for the substrate mounting table) for cooling the wafer W via the susceptor 12 to prevent an excessive temperature rise of the wafer W over the preset temperature. The coolant circulation system may control the temperature of the wafer W by controlling a temperature of the susceptor 12.

The coolant circulation system may include a coolant pipe 19 connecting an inlet 15a and an outlet 15b of the heat transfer medium path 15 at the outside of the chamber 11; and a coolant supply unit (heat transfer medium supply unit) 20 installed on a part of the coolant pipe 19. With this configuration, the coolant circulation system circulates the coolant through the heat transfer medium path 15. The coolant supply unit 20 may serve as a force-feed pump, and it may force-feed the coolant discharged into the coolant pipe 19 from the outlet 15b toward the inlet 15a. Further, the coolant supply unit 20 may also function as a heat exchanger and cool the coolant which has become high temperature after absorbing heat of the susceptor 12. Here, the coolant supply unit 20 may cool the coolant to a relatively low temperature (first temperature) of, e.g., about 10° C. in order to maintain the temperature of the susceptor 12 or to decrease the temperature of the susceptor during the plasma etching process. In this way, the coolant (first heat transfer medium) supplied into the heat transfer medium path 15 from the coolant supply unit 20 may be maintained at a relatively low temperature.

Further, the coolant circulation system may further include a high temperature medium storage tank (heat transfer medium storage tank at one side) 21 connected with a branch pipe 19a branched from the coolant pipe 19 between the inlet 15a of the heat transfer medium path 15 and the coolant supply unit 20; a high temperature medium storage tank (heat transfer medium storage tank at the other side) connected with a branch pipe 19b branched from the coolant pipe 19 between the outlet 15b of the heat transfer medium path 15 and the coolant supply unit 20; a first valve set (heat transfer medium supply control device) 23 provided on a part of the coolant pipe 19 between the coolant supply unit 20 and the inlet 15a of the heat transfer medium path 15 and between the high temperature medium storage tank 21 and the inlet 15a of the heat transfer medium path 15; and a second valve set (heat transfer medium supply control device) 24 provided on a part of the coolant pipe 19 between the coolant supply unit 20 and the outlet 15b of the heat transfer medium path 15 and between the high temperature medium storage tank 22 and the outlet 15b of the heat transfer medium path 15.

The high temperature medium storage tank 21 may store therein a high temperature medium (second heat transfer medium) of a relatively high temperature (second temperature), e.g., about 80° C. higher than the temperature (e.g., about 10° C.) of the coolant supplied by the coolant supply unit 20. The high temperature medium storage tank 22 may also store a high temperature medium. Further, each of the high temperature medium storage tanks 21 and 22 may have heat-keeping characteristics and thus keeps heat of the high temperature medium stored therein. In addition, each of the high temperature medium storage tanks 21 and 22 may include a medium heater (medium heating unit) (not shown) composed of a wall heater or the like and, thus, is capable of heating the high temperature medium stored therein.

In the present embodiment, the high temperature medium is transferred between the high temperature medium storage tank 21 and the high temperature medium storage tank as will be described later. Thus, before the plasma etching process is performed, it may be desirable to store the high temperature medium in the high temperature medium storage tank 21 while the high temperature medium storage tank 22 is empty. By way of example, galden (registered trademark) or fluorinert (registered trademark) may be used as the coolant or the high temperature medium in the present embodiment. Especially, since the coolant and the high temperature medium may be mixed in the coolant pipe 19 or in the heat transfer medium path 15, materials having the same physical properties may be used as the coolant and the high temperature medium, desirably.

The first valve set 23 may include a valve 23a installed on the coolant pipe 19 and a valve 23b installed on the branch pipe 19a. If the valve 23a is opened while the valve 23b is closed, the coolant supply unit 20 communicates with the heat transfer medium path 15, whereas if the valve 23a is closed while the valve 23b is opened, the high temperature medium storage tank 21 communicates with the heat transfer medium path 15. Meanwhile, the second valve set 24 may include a valve 24a installed on the coolant pipe 19 and a valve 24b installed on the branch pipe 19b. If the valve 24a is opened while the valve 24b is closed, the coolant supply unit 20 communicates with the heat transfer medium path 15, whereas if the valve 24a is closed while the valve 24b is opened, the high temperature medium storage tank 22 communicates with the heat transfer medium path 15.

Figure 2:
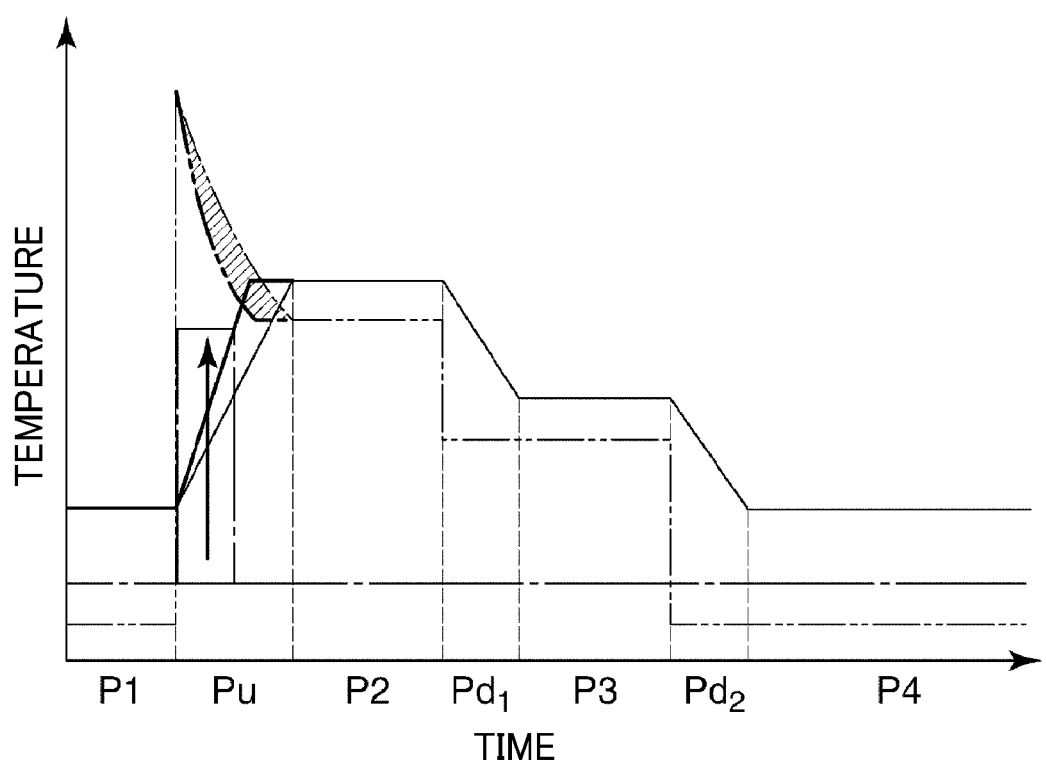
FIG. 2 is a graph showing a relationship between temperature and time of a susceptor, a heater and a heat transfer medium path in a plasma etching process.

FIG. 2 is a graph showing a relationship between temperature and time of the susceptor, the heater and the heat transfer medium path in a plasma etching process. In FIG. 2, a solid line represents a temperature of the susceptor 12; a double-dotted line, an output of the heater 14; a single-dotted line, a temperature of the heat transfer medium path 15.

Typically, the plasma etching process may be divided into a plurality of processes P1, P2, P3 and P4, as depicted in FIG. 2, and the wafer W or the susceptor 12 may be maintained at a desired temperature (preset temperature) in each process (temperature maintaining step). Since, however, the desired temperature may vary in the different processes, processes Pu, Pd1, and Pd2 of increasing or decreasing the temperature of the wafer W or the temperature of the susceptor 12 need to be performed between two consecutive processes (temperature increasing step or temperature decreasing step).

In order to maintain the susceptor 12 at a desired temperature (processes P1, P2, P3 and P4), power is supplied to the heater 14, and a coolant is supplied into the heat transfer medium path 15. Here, a heat generation amount of the heater 14 may be controlled such that the sum of a heat amount from plasma and the heat generation amount of the heater 14 becomes substantially equal to a heat amount absorbed into the coolant flowing through the heat transfer medium path 15. By way of example, in case that a heat amount from the plasma is excessively great, the heater 14 may not be operated, thus allowing the heat amount from the plasma becomes substantially equal to the heat amount absorbed into the coolant flowing through the heat transfer medium path 15.

Meanwhile, in order to decrease the temperature of the susceptor 12 (processes Pd1 and Pd2), the power supply to the heater 14 is stopped, and the coolant as a heat transfer medium is supplied into the heat transfer medium path 15. Here, since the heater 14 does not generate heat, heat of the susceptor 12 can be efficiently absorbed into the coolant flowing through the heat transfer medium path 15, and, thus, the temperature of the susceptor 12 can be rapidly reduced.

Meanwhile, in order to increase the temperature of the susceptor 12 (process Pu), power is supplied to the heater 14 and thus the heater 14 generates heat. However, if the coolant exits within the heat transfer medium path 15 at the moment, a temperature difference between the heater 14 and the heat transfer medium path 15 would be increased. Since the magnitude of heat transfer depends on the temperature difference, a heat amount absorbed from the heater 14 into the coolant flowing through the heat transfer medium path 15 would be increased. As a consequence, it would take more time to increase the temperature of the susceptor 12.

In accordance with the present embodiment, however, when the temperature of the susceptor 12 is increased by generating heat from the heater 14, a high temperature medium as a heat transfer medium, not the coolant, exists within the heat transfer medium path 15, thereby reducing a temperature difference between the heater 14 and the heat transfer medium path 15 (as indicated by an arrow of FIG. 2). Accordingly, a part of heat from the heater 14 can be suppressed from being absorbed into the coolant flowing through the heat transfer medium path 15, and, thus, the heat from the heater 14 can be efficiently used for a temperature rise of the susceptor 12. As a result, the temperature of the susceptor 12 can be rapidly increased (as indicated by a thick solid line of FIG. 2). Furthermore, since the temperature of the susceptor 12 can be rapidly increased, a time period for increasing an output of the heater 14 can be shortened (as indicated by a thick double-dotted line of FIG. 2), and, thus, power corresponding to a shaded area of FIG. 2 can be saved.

Now, a temperature control method for the substrate mounting table in accordance with the present embodiment will be explained.

FIGS. 3A to 3D are process diagrams illustrating the temperature control method for the substrate mounting table in accordance with the present embodiment. The temperature control method is performed by the coolant circulation system of the substrate processing apparatus 10 of FIG. 1 through processes P1, Pu and P2 of FIG. 2.

In the process P1 (FIG. 3A), the valve 23a of the first valve set 23 is opened while the valve 23b is closed, and the valve 24a of the second valve set 24 is opened while the valve 24b is closed. Accordingly, a coolant as a heat transfer medium cooled by the coolant supply unit 20 is supplied into the heat transfer medium path 15 (as indicated by an arrow of FIG. 3A). Here, although the heater 14 generates heat, the coolant flowing through the heat transfer medium path 15 absorbs a part of heat from the heater 14. Thus, a temperature of the susceptor 12 may not be increased but be maintained substantially constant.

Subsequently, if the process Pu is begun (FIG. 3B), the valve 23a of the first valve set 23 is closed while the valve 23b is opened, and the valve 24a of the second valve set 24 is closed while the valve 24b is opened. Accordingly, the supply of the coolant into the heat transfer medium path is stopped, and, instead, a high temperature medium stored in the high temperature medium storage tank 21 is supplied into the heat transfer medium path 15 and, also, supplied into the high temperature medium storage tank 22 via the heat transfer medium path 15 (as indicated by an arrow of FIG. 3B). Here, although the heater 14 also generates heat, absorption of a part of the heat from the heater 14 into the high temperature medium flowing through the heat transfer medium path 15 can be suppressed because a temperature difference between the heater 14 and the heat transfer medium path 15 may be reduced by the high temperature medium. As a consequence, a temperature of the susceptor 12 can be rapidly increased.

Figure 3A:
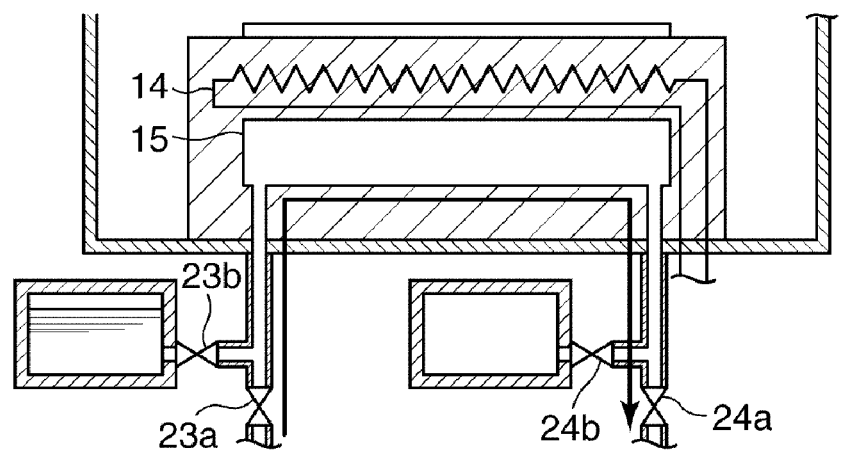
FIGS. 3A to 3D are process diagrams illustrating a temperature control method for the substrate mounting table in accordance with the embodiment of the present disclosure.
Figure 3B:
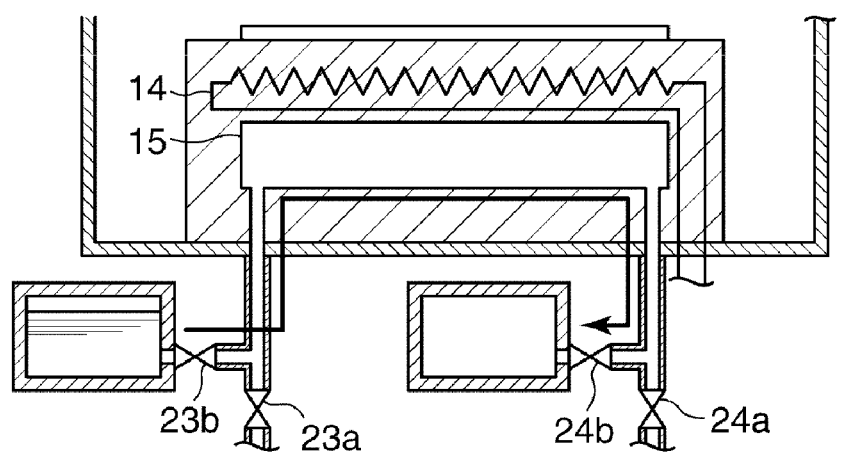
Figure 3C:
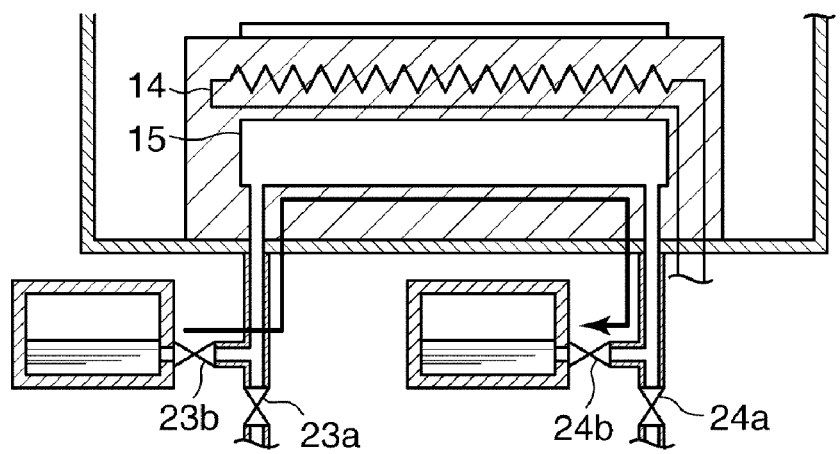
Figure 3D:
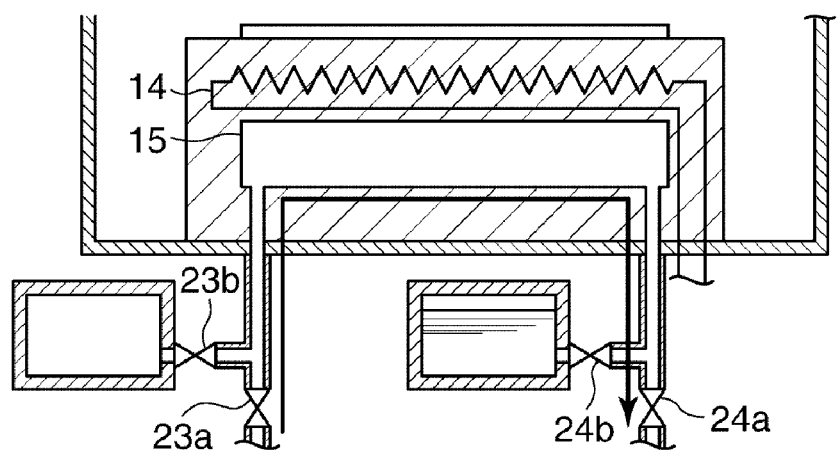
Figure 4A:
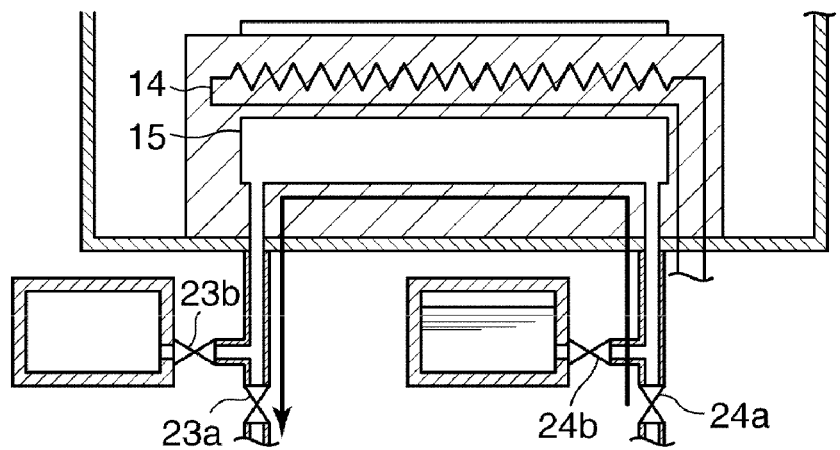
FIGS. 4A to 4D are process diagrams illustrating a temperature control method for the substrate mounting table performed after the temperature control method of FIG. 3.
Figure 4B:
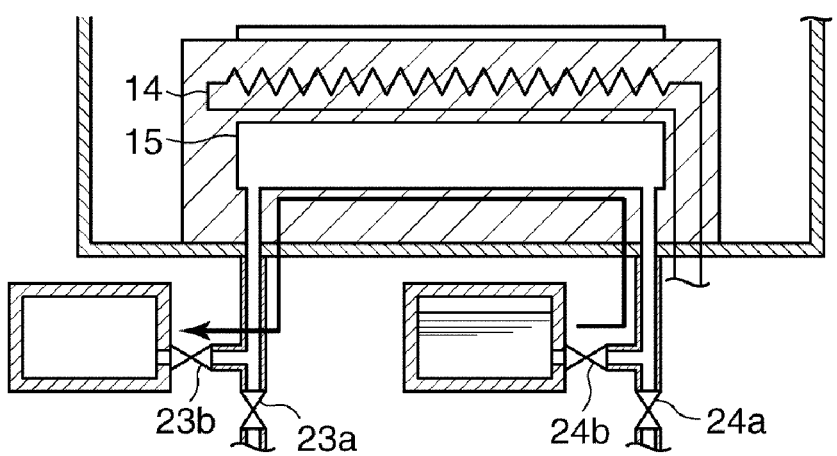
Figure 4C:
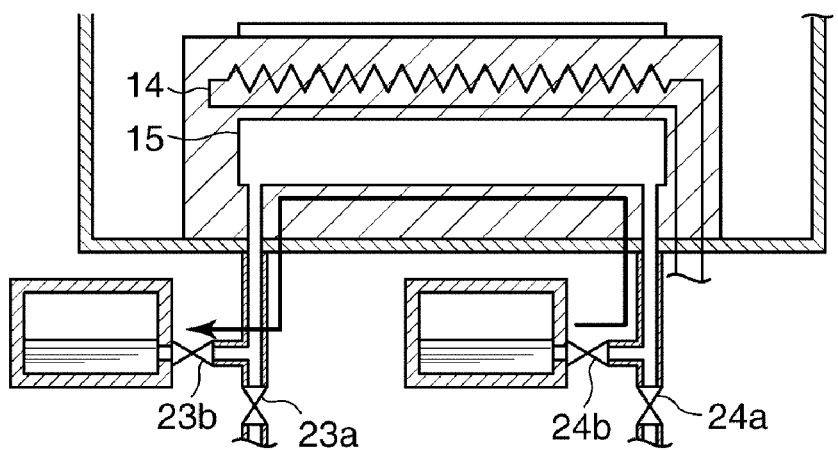
Figure 4D:
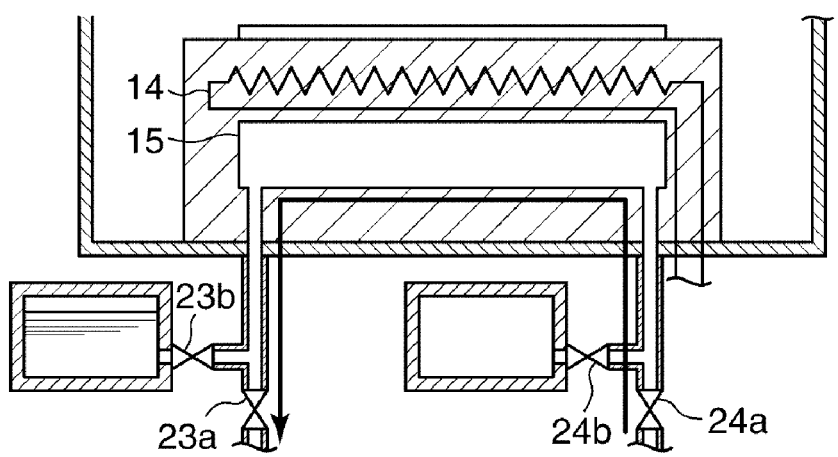

Thereafter, the current states of the first valve set 23 and the second valve set 24 are maintained for a certain time period, and the high temperature medium is kept being supplied from the high temperature medium storage tank 21 into the high temperature medium storage tank 22 via the heat transfer medium path 15 (FIG. 3C) (as indicated by an arrow of FIG. 3C). In the meantime, the temperature of the susceptor 12 keeps on increasing rapidly. Here, since the high temperature medium transfers heat while it flows through the heat transfer medium path 15, a temperature of the high temperature medium introduced and stored in the high temperature medium storage tank 22 may become lower than a temperature (hereinafter, referred to as an 'initial temperature') of the high temperature medium when it is stored in the high temperature medium storage tank 21. Thus, the heat transfer medium storage tank 22 may heat the stored high temperature medium up to the initial temperature by a medium heater and maintain the high temperature medium at the initial temperature therein.

Subsequently, if the temperature of the susceptor 12 approaches a desired temperature for the process P2, the valve 23a of the first valve set 23 is opened while the valve 23b is closed, and the valve 24a of the second valve set 24 is opened while the valve 24b is closed before the process Pu is terminated. Accordingly, the supply of the high temperature medium into the heat transfer medium path 15 is stopped, and the coolant cooled by the coolant supply unit 20 is supplied into the heat transfer medium path 15 (FIG. 3D) (as indicated by an arrow of FIG. 3D). Since the coolant flowing through the heat transfer medium path 15 absorbs a part of the heat from the heater 14, overheating of the susceptor 12 may be prevented successfully. Thus, a temperature rise (overshoot) of the susceptor 12 beyond the desired temperature for the process P2 can be prevented.

Then, if the temperature of the susceptor 12 reaches the desired temperature for the process P2, the process may continue from the process Pu to the process P2.

FIGS. 4A to 4D are process diagrams illustrating a temperature control method for the substrate mounting table performed after the temperature control method of FIGS. 3A to 3D. This temperature control method is also performed by the coolant circulation system of the substrate processing apparatus 10 of FIG. 1 through processes P1, Pu and P2 of FIG. 2.

First, in the process P1 (FIG. 4A), the valve 23a of the first valve set 23 is opened while the valve 23b is closed, and the valve 24a of the second valve set 24 is opened while the valve 24b is closed. Accordingly, the coolant cooled by the coolant supply unit 20 is supplied into the heat transfer medium path 15 (as indicated by an arrow of FIG. 4A). Unlike in FIG. 3A, however, the coolant as a heat transfer medium is supplied into the heat transfer medium path 15 from the outlet 15b by the coolant supply unit 20. Regardless of a flow direction of the coolant, however, the coolant flowing through the heat transfer medium path 15 may absorb a part of heat from the heater 14, so that the temperature of the susceptor 12 may not be increased but may be maintained substantially constant.

Then, if the process Pu is begun (FIG. 4B), the valve 23a of the first valve set 23 is closed while the valve 23b is opened, and the valve 24a of the second valve set 24 is closed while the valve 24b is opened. Accordingly, the supply of the coolant into the heat transfer medium path 15 is stopped, and the high temperature medium stored in the high temperature medium storage tank 22 is supplied into the heat transfer medium path 15 through the outlet 15b and, also, supplied into the high temperature medium storage tank 21 via the heat transfer medium path 15 (as indicated by an arrow of FIG. 4B). Here, since the temperature of the high temperature medium stored in the high temperature medium storage tank 22 is raised to the initial temperature by the medium heater as mentioned above, a temperature difference between the heater 14 and the heat transfer medium path 15 into which the high temperature medium is supplied may be reduced. As a result, a temperature of the susceptor 12 can be rapidly increased.

Thereafter, the current states of the first valve set 23 and the second valve set 24 are maintained for a certain time period (FIG. 4C), and, thus, the temperature of the susceptor 12 keeps on increasing rapidly. Here, the high temperature medium storage tank 21 may heat the high temperature medium supplied and stored therein by the medium heater up to the initial temperature and maintain the high temperature medium at the initial temperature.

Afterward, if the temperature of the susceptor 12 approaches a desired temperature for the process P2, the valve 23a of the first valve set 23 is opened while the valve 23b is closed, and the valve 24a of the second valve set 24 is opened while the valve 24b is closed before the process Pu is terminated. Accordingly, a temperature rise of the susceptor 12 beyond the desired temperature for the process P2 can be prevented.

Then, if the temperature of the susceptor 12 reaches the desired temperature for the process P2, the process may continue from the process Pu to the process P2.

In the temperature control methods for the substrate mounting table described in FIGS. 3A to 3D and in FIGS. 4A to 4D, although it has been described that the supply of the high temperature medium into one of the high temperature medium storage tanks 21 and 22 is continued until the other is emptied, the supply of the high temperature medium need not be continued until one high temperature medium storage tank 21 or 22 is emptied. By way of example, the supply of the high temperature medium into one of the high temperature medium storage tanks 21 and 22 may be stopped even if a certain amount of high temperature medium remains in the other one. In such a case, the high temperature medium remaining in the other of the high temperature medium storage tanks 21 and 22 may be directly sent into the one of the high temperature medium storage tanks 21 and 22 via a non-illustrated bypass passage.

The present inventors conducted experiments to examine operations and effects of the temperature control methods for the substrate mounting table in accordance with the present disclosure. In the temperature control methods in FIGS. 3A to 3D and in FIGS. 4A to 4D, a volume, a specific heat and a specific gravity of the susceptor 12 were set to about 0.00398 $m^3$, about 900 J/kg·k, and about 2700 $kg/m^3$, respectively; a surface area of the heat transfer medium path 15 was set to about 0.16 $m^2$; a thermal conductivity of a heat transfer surface between the coolant (high temperature medium) in the heat transfer medium path 15 and the susceptor 12 was set to about 4300 $W/m^2 \cdot k$; and a heat capacity of the susceptor 12 was set to about 9671.4 J/k. In an experiment (experimental example), a temperature rise of the susceptor 12 in the process Pu of the temperature control method for the substrate mounting table in FIGS. 3A to 3D was simulated by calculating the temperature of the susceptor 12 at a relatively short time interval, and the result is indicated by marks '●' in a graph of FIG. 5. Further, in another experiment (comparative example), a temperature rise of the susceptor 12 in the process Pu was also simulated in a similar way while constantly supplying the coolant into the heat transfer medium path 15 from the coolant supply unit 20, and the result (comparative example) is indicated by marks 'x' in the graph of FIG. 5.

Figure 5:
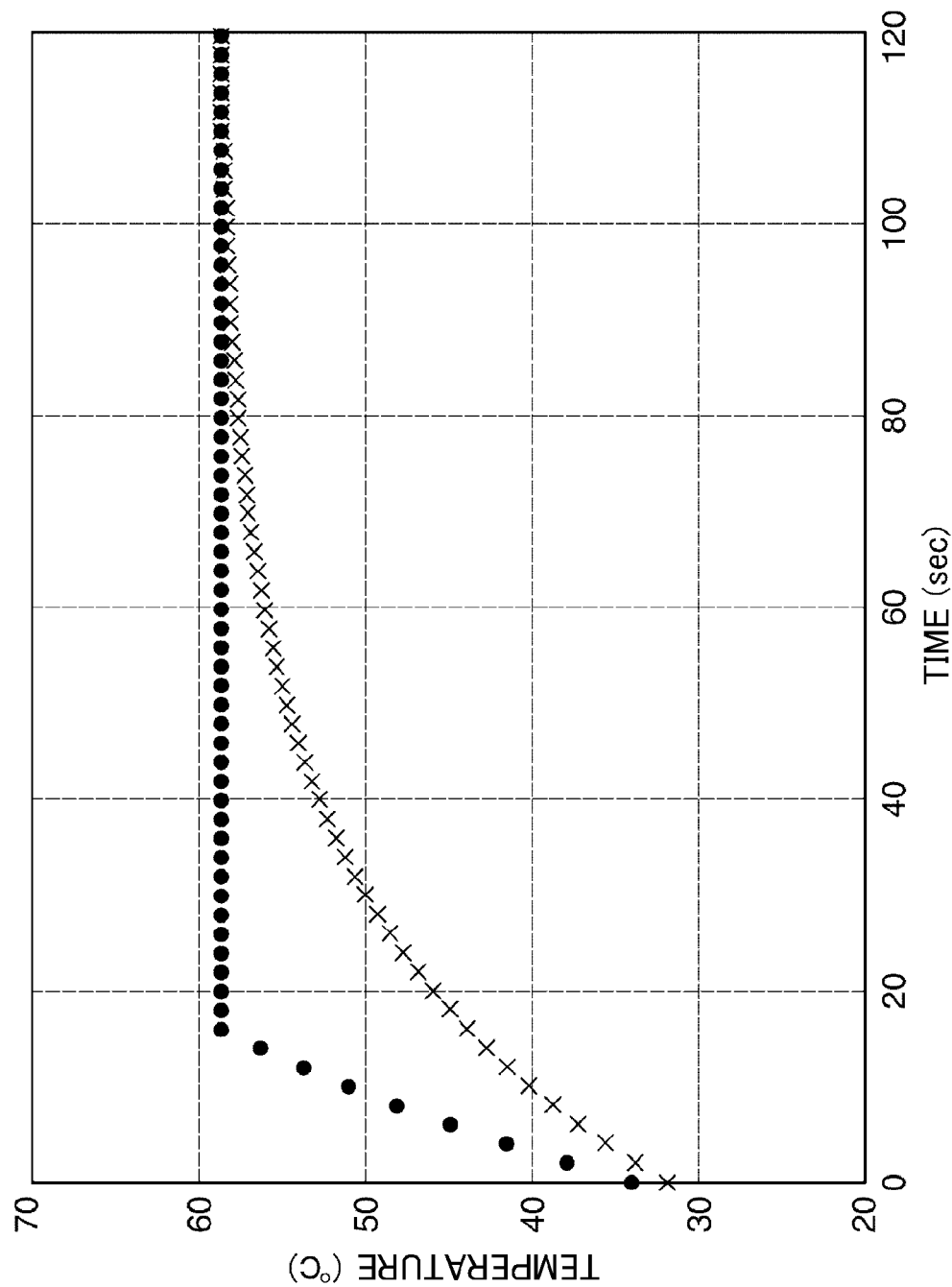
FIG. 5 is a graph showing a result of a simulation using the temperature control method for the substrate mounting table in accordance with the embodiment of the present disclosure.

As can be seen from the graph of FIG. 5, the temperature of the susceptor 12 can be increased more rapidly in the experimental example, as compared to the comparative example.

In accordance with the temperature control methods for the substrate mounting table in FIGS. 3A to 3D and in FIGS. 4A to 4D, when the heater 14 generates heat (process Pu), the supply of the coolant into the heat transfer medium path 15 is stopped, and the high temperature medium is supplied into the heat transfer medium path 15. Accordingly, a part of heat from the heater 14 can be suppressed from being absorbed into the coolant flowing through the heat transfer medium path 15, so that a temperature of the susceptor 12, and, also, a temperature of the wafer W can be increased rapidly, and a loss of thermal energy can be reduced.

Further, in accordance with the temperature control methods for the substrate mounting table in FIGS. 3A to 3D and in FIGS. 4A to 4D, the high temperature medium is supplied into the high temperature medium storage tank 22 from the high temperature medium storage tank 21 through the heat transfer medium path 15 in the process Pu. Then, in a next process Pu, the high temperature medium is supplied via the heat transfer medium path 15 back into the high temperature medium storage tank 21 from the high temperature medium storage tank 22 storing therein the high temperature medium supplied in the previous process Pu. Thus, the high temperature medium can be reutilized while its temperature is hardly reduced. As a result, it may not be necessary to heat a low temperature medium to a high temperature medium of an initial temperature, and, thus, thermal energy can be saved.

Furthermore, in the temperature control methods for the substrate mounting table in FIGS. 3A to 3D and in FIGS. 4A to 4D, the kind of the heat transfer medium to be used may be selected depending on involved processes. To elaborate, in order to maintain the temperature of the susceptor 12 at a desired level (processes P1, P2, P3 and P4) and to reduce the temperature of the susceptor 12 (processes Pd1 and Pd2), the coolant may be supplied into the heat transfer medium path 15 from the coolant supply unit 20. On the other hand, when the heater 4 generates heat (process Pu), the high temperature medium may be supplied into the heat transfer medium path 15 from the high temperature medium storage tank 21 or 22. Accordingly, a temperature of the heat transfer medium path 15 can be altered rapidly.

Desirably, in the temperature control methods for the substrate mounting table in FIGS. 3A to 3D and in FIGS. 4A to 4D, a temperature of the high temperature medium when it is stored in the high temperature medium storage tank 21 before the plasma etching process is begun, i.e., an initial temperature of the high temperature medium may be set to be lower than a desired temperature for the process P2 of the plasma etching process. Accordingly an overheating of the susceptor 12 beyond the desired temperature by the high temperature medium in the process Pu can be securely avoided.

Further, although the coolant circulation system shown in FIG. 1 has been described to include the two high temperature medium storage tanks 21 and 22, the coolant circulation system may not be equipped with the two high temperature medium storage tanks as long as a high temperature medium can be supplied into the heat transfer medium path 15.

Figure 6A:
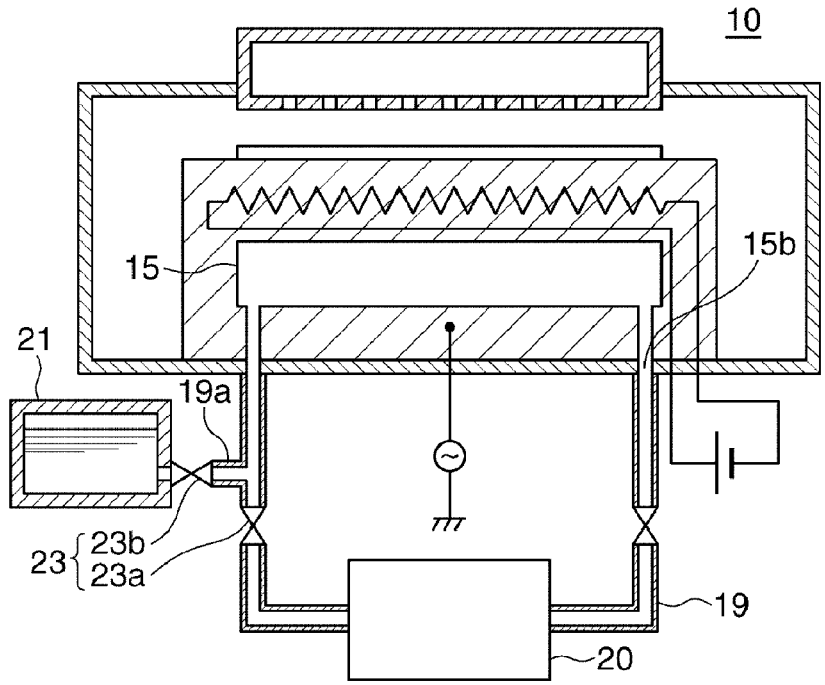
FIGS. 6A and 6B are cross sectional views illustrating schematic configurations of a first modification example and a second modification example of the temperature control system for the substrate mounting table in accordance with the embodiment of the present disclosure.

By way of example, as illustrated in FIG. 6A, the coolant circulation system may have one high temperature medium storage tank 21 connected with the branch pipe 19*a* of the coolant pipe 19. In such a case, in a process Pu, the valve 23*a* of the first valve set 23 is closed while the valve 23*b* is opened, and, thus, the high temperature medium stored in the high temperature medium storage tank 21 is supplied into the heat transfer medium path 15. Then, the high temperature medium having flown through the heat transfer medium path 15 may be discharged into the coolant pipe 19 through the outlet 15*b* and stay in the coolant pipe 19. Thereafter, the valves 23*a* and 23*b* of the first valve set 23 are both opened in a process P2, and, thus, the coolant cooled by the coolant supply unit 20 is supplied into the high temperature medium storage tank 21 as well as into the heat transfer medium path 15. The high temperature medium storage tank 21 may store the supplied coolant therein, and heat the stored coolant by the medium heater up to the initial temperature and maintain the heated coolant at the initial temperature. The coolant (high temperature medium) of which temperature is raised to the initial temperature may be supplied from the high temperature medium storage tank 21 into the heat transfer medium path 15 in a next process Pu.

Figure 6B:
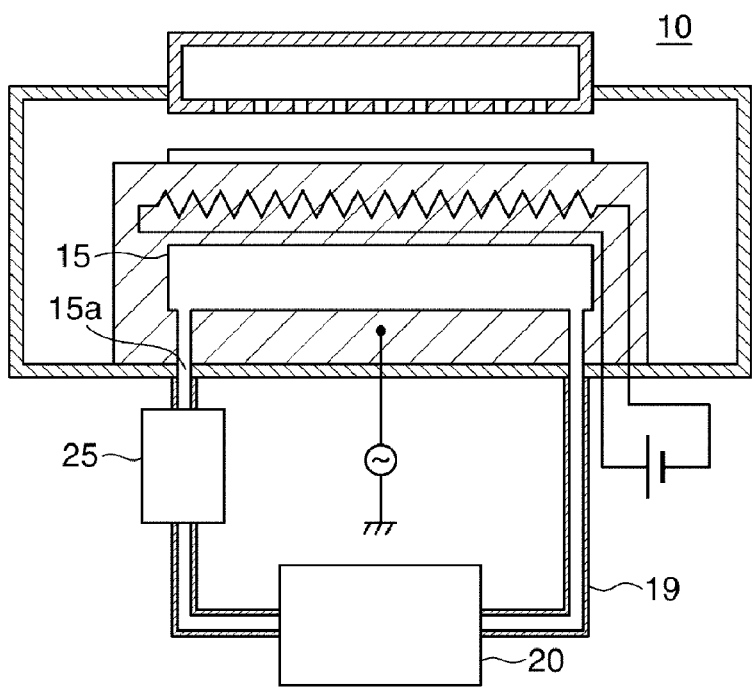

Furthermore, as depicted in FIG. 6B, for example, the coolant circulation system may not have a high temperature medium storage tank but has a rapid heater 25 on a part of the coolant pipe 19 in the vicinity of the inlet 15*a* of the heat transfer medium path 15. In such a case, the rapid heater 25 may be operated in a process Pu to rapidly heat the coolant cooled by the coolant supply unit 20 up to an initial temperature and maintain the coolant at the initial temperature. The coolant (high temperature medium) of which temperature is increased up to the initial temperature may be supplied into the heat transfer medium path 15.

In the above-described embodiments, the substrate on which the plasma etching process is performed may not be limited to a wafer for a semiconductor device, but it may be any of various kinds of substrates for use in a FPD (Flat Panel Display) including a LCD (Liquid Crystal Display), a photo mask, a CD substrate, a print substrate, or the like.

What is claimed is:

1. A temperature control system for a substrate mounting table that includes a heating unit and a heat transfer medium path and mounts thereon a substrate on which a preset process is performed, the system comprising:

a first pipe connected with an inlet of the heat transfer medium path at an outside of a chamber in which the preset process is performed;

a second pipe connected with an outlet of the heat transfer medium path at the outside of the chamber;

a heat transfer medium supply connected with the first and second pipes and configured to supply a first heat transfer medium of a first temperature into the heat transfer medium path via the first pipe;

a first heat transfer medium storage connected with a first branch pipe branched from the first pipe and configured to store therein a second heat transfer medium of a second temperature higher than the first temperature;

a second heat transfer medium storage connected with a second branch pipe branched from the second pipe and configured to store therein the second heat transfer medium; and a heat transfer medium supply control device configured to stop a supply of the first heat transfer medium into the heat transfer medium path from the heat transfer medium supply and to supply the second heat transfer medium into the heat transfer medium path when the heating unit generates heat, comprising;

a first valve set provided on the first pipe between the heat transfer medium supply and the inlet of the heat transfer medium path and between the first heat transfer medium storage and the inlet of the heat transfer medium path; and a second valve set provided on the second pipe between the heat transfer medium supply and the outlet of the heat transfer medium path and between the second heat transfer medium storage and the outlet of the heat transfer medium path, wherein the first valve set includes a first pipe valve installed on the first pipe and a first branch pipe valve installed on the first branch pipe, and the second valve set includes a second pipe valve installed on the second pipe and a second branch pipe valve installed on the second branch pipe, wherein the first valve set and the second valve set are configured to alternate the direction of the second heat transfer medium throughout the heat transfer medium path between the first heat transfer medium storage and the second heat transfer medium storage, and wherein the heat transfer medium supply control device is configured to supply the second heat transfer medium from the first heat transfer medium storage into the second heat transfer medium storage via the heat transfer medium path when the heating unit generates heat, and to supply the second heat transfer medium from the second heat transfer medium storage into the first heat transfer medium storage via the heat transfer medium path when the heating unit generates heat in a next process.

2. The temperature control system of claim 1, wherein each of the first heat transfer medium storage and the second heat transfer medium storage includes a medium heating unit that heats the second transfer medium stored in the each of the first heat transfer medium storage and the second heat transfer medium storage.

3. The temperature control system of claim 1, wherein the second temperature is lower than a desired temperature of the substrate mounting table for the preset process.

4. A temperature control method for a substrate mounting table that includes a heating unit and a heat transfer medium path and mounts thereon a substrate on which a preset process is performed, the method comprising:

increasing a temperature of the substrate mounting table by generating heat from the heating unit;

maintaining the temperature of the substrate mounting table at a preset temperature; and decreasing the temperature of the substrate mounting table, wherein a first heat transfer medium of a first temperature is supplied into the heat transfer medium path in the temperature maintaining process and in the temperature decreasing process, whereas, in the temperature increasing process, the supply of the first heat transfer medium into the heat transfer medium path is stopped and a second heat transfer medium of a second temperature higher than the first temperature is supplied into the heat transfer medium path, a first pipe is connected with an inlet of the heat transfer medium path at an outside of a chamber in which the preset process is performed, and a second pipe is connected with an outlet of the heat transfer medium path at the outside of the chamber, a first heat transfer medium storage configured to store therein the second heat transfer medium is connected with a first branch pipe branched from the first pipe, and a second heat transfer medium storage configured to store therein the second heat transfer medium is connected with a second branch pipe branched from the second pipe, a first valve set is provided on the first pipe between a heat transfer medium supply for supplying the first heat transfer medium of the first temperature and the inlet of the heat transfer medium path and between the first heat transfer medium storage and the inlet of the heat transfer medium path, a second valve set is provided on the second pipe between the heat transfer medium supply and the outlet of the heat transfer medium path and between the second heat transfer medium storage and the outlet of the heat transfer medium path, the first valve set includes a first pipe valve installed on the first pipe and a first branch pipe valve installed on the first branch pipe, and the second valve set includes a second pipe valve installed on the second pipe and a second branch pipe valve installed on the second branch pipe, and the first valve set and the second valve set are configured to alternate the direction of the second heat transfer medium throughout the heat transfer medium path between the first heat transfer medium storage and the second heat transfer medium storage, wherein in the temperature maintaining process and in the temperature decreasing process, a heat transfer medium supply connected with the first and second pipes supplies the first heat transfer medium into the heat transfer medium path, in the temperature increasing process, the first heat transfer medium storage supplies the second heat transfer medium into the second heat transfer medium storage via the heat transfer medium path, and in a next temperature increasing process, the second heat transfer medium storage supplies the second heat transfer medium into the first heat transfer medium storage via the heat transfer medium path.

5. The temperature control method of claim 4, wherein the second temperature is lower than a desired temperature for the substrate mounting table in the preset process.

6. The temperature control method of claim 4, wherein, in the temperature increasing process, the supply of the second heat transfer medium into the heat transfer medium path is stopped and the first heat transfer medium is supplied into the heat transfer medium path before the temperature increasing process is terminated.

* * * * *

UNITED STATES PATENT AND TRADEMARK OFFICE
CERTIFICATE OF CORRECTION

| | |
|---|---|
| PATENT NO. | : 8,950,469 B2 |
| APPLICATION NO. | : 12/902225 |
| DATED | : February 10, 2015 |
| INVENTOR(S) | : Yasuharu Sasaki |

It is certified that error appears in the above-identified patent and that said Letters Patent is hereby corrected as shown below:

In the specification,

Column 6, line 34, please add -- 12 -- between "susceptor" and "during"

Column 6, line 44, please add -- 22 -- between "side)" and "connected"

Column 7, line 7, please add -- 22 -- between "tank" and "as"

Column 8, line 58, please add -- 15 -- between "path" and "is"

Signed and Sealed this
Fourteenth Day of July, 2015

Michelle K. Lee
*Director of the United States Patent and Trademark Office*